(12) United States Patent
Lim et al.

(10) Patent No.: US 11,145,807 B2
(45) Date of Patent: Oct. 12, 2021

(54) ELECTRONIC DEVICE

(71) Applicant: SK hynix Inc., Icheon-si (KR)

(72) Inventors: Jongkoo Lim, Icheon-si (KR); Gukcheon Kim, Yeoju-si (KR); Soogil Kim, Seongnam-si (KR); Jeongmyeong Kim, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/894,301

(22) Filed: Jun. 5, 2020

(65) Prior Publication Data
US 2021/0098687 A1    Apr. 1, 2021

(30) Foreign Application Priority Data
Oct. 1, 2019  (KR) .................... 10-2019-0121616

(51) Int. Cl.
| | |
|---|---|
| *H01L 43/02* | (2006.01) |
| *G11C 11/16* | (2006.01) |
| *H01L 43/10* | (2006.01) |
| *H01L 43/12* | (2006.01) |
| *H01F 10/32* | (2006.01) |

(Continued)

(52) U.S. Cl.
CPC ............ *H01L 43/02* (2013.01); *G06F 3/0604* (2013.01); *G06F 3/0659* (2013.01); *G06F 3/0673* (2013.01); *G06F 13/1668* (2013.01); *G11C 11/161* (2013.01); *H01F 10/329* (2013.01); *H01F 10/3254* (2013.01); *H01F 10/3286* (2013.01); *H01F 41/32* (2013.01);

(Continued)

(58) Field of Classification Search
CPC ......... H01L 43/02; H01L 43/10; H01L 43/12; H01L 27/222; H01L 43/08; H01L 27/22; G11C 11/161; H01F 10/329; H01F 10/3286; H01F 41/32; H01F 10/3254; H01F 10/30; H01F 10/3268; G06F 13/1668; G06F 3/0604; G06F 3/0659; G06F 3/0673
USPC .......................................... 711/154
See application file for complete search history.

(56) References Cited

U.S. PATENT DOCUMENTS

| | | | |
|---|---|---|---|
| 6,341,052 B2 * | 1/2002 | Hayashi ............... | B82Y 10/00 360/324.1 |
| 6,977,801 B2 | 12/2005 | Carey et al. | |

(Continued)

FOREIGN PATENT DOCUMENTS

| | | | | |
|---|---|---|---|---|
| EP | 2524396 B1 * | 10/2020 | ........... | G11C 11/161 |
| KR | 10-2012-0025489 A | 3/2012 | | |

(Continued)

*Primary Examiner* — Fernando Hidalgo
(74) *Attorney, Agent, or Firm* — Perkins Coie LLP

(57) ABSTRACT

An electronic device may include a semiconductor memory, and the semiconductor memory may include a substrate; a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and an interface layer and a damping constant enhancing layer interposed between the tunnel barrier layer and the pinned layer, wherein the interface layer may be structured to reduce metal diffusion and the damping constant enhancing layer includes a material having a relatively high damping constant to suppress switching of the magnetization direction of the pinned layer.

20 Claims, 13 Drawing Sheets

(51) Int. Cl.
*G06F 13/16* (2006.01)
*H01F 41/32* (2006.01)
*H01L 27/22* (2006.01)
*G06F 3/06* (2006.01)

(52) U.S. Cl.
CPC ............ *H01L 27/222* (2013.01); *H01L 43/10* (2013.01); *H01L 43/12* (2013.01)

(56) References Cited

U.S. PATENT DOCUMENTS

| | | | | |
|---|---|---|---|---|
| 7,428,130 | B2* | 9/2008 | Jogo | B82Y 25/00 |
| | | | | 360/324.12 |
| 9,048,412 | B2* | 6/2015 | Oh | H01L 43/02 |
| 9,478,355 | B2* | 10/2016 | Zhang | H01L 43/12 |
| 9,647,204 | B2 | 5/2017 | Hu et al. | |
| 9,680,089 | B1 | 6/2017 | Chen et al. | |
| 9,859,488 | B2* | 1/2018 | Lee | H01L 43/12 |
| 10,763,428 | B2* | 9/2020 | Liu | H01F 10/3295 |
| 10,885,960 | B2* | 1/2021 | Hong | H01L 43/12 |
| 10,910,032 | B2* | 2/2021 | Kishi | G11C 11/1673 |
| 2007/0268632 | A1* | 11/2007 | Jogo | H01L 43/08 |
| | | | | 360/324.12 |
| 2012/0235258 | A1* | 9/2012 | Zhao | B82Y 40/00 |
| | | | | 257/421 |
| 2016/0190434 | A1 | 6/2016 | Hu et al. | |
| 2017/0084667 | A1* | 3/2017 | Lim | G06F 3/0647 |
| 2017/0194554 | A1* | 7/2017 | Kim | H01L 43/12 |
| 2019/0189172 | A1* | 6/2019 | Higo | H01L 27/228 |
| 2020/0388425 | A1* | 12/2020 | Jung | G11C 11/161 |

FOREIGN PATENT DOCUMENTS

| | | |
|---|---|---|
| KR | 10-2014-0025166 A | 3/2014 |
| KR | 10-2014-0115246 A | 9/2014 |

* cited by examiner

ELECTRONIC DEVICE

CROSS-REFERENCE TO RELATED APPLICATION

This patent document claims priority of Korean Patent Application No. 10-2019-0121616, entitled "ELECTRONIC DEVICE" and filed on Oct. 1, 2019, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element that exhibits different resistance states for storing data.

In one aspect, an electronic device may include a semiconductor memory, and the semiconductor memory may include a substrate; a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and an interface layer and a damping constant enhancing layer interposed between the tunnel barrier layer and the pinned layer, wherein the interface layer may be structured to reduce metal diffusion and the damping constant enhancing layer includes a material having a relatively high damping constant to suppress switching of the magnetization direction of the pinned layer.

In another aspect, an electronic device may include a semiconductor memory, and the semiconductor memory may include: a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; a first interface layer and a second interface layer which are interposed between the tunnel barrier layer and the pinned layer; and a damping constant enhancing layer interposed between the first interface layer and the second interface layer, wherein the damping constant enhancing layer may include a material having a damping constant higher than that of a magnetic material including Co, Fe, or B.

In another aspect, an electronic device may include a semiconductor memory, and the semiconductor memory may include: a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; a conductive layer interposed between the tunnel barrier layer and the pinned layer, wherein the conductive layer may include a first metal material having a relatively high damping constant to facilitate fixing the fixed magnetization direction of the pinned layer and a second metal material that is structured to reduce metal diffusion from other layers included in the semiconductor memory to the tunnel barrier layer. In some implementations, the first metal material includes a heavy metal. In some implementations, the first metal material includes at least one of tungsten (W), ruthenium (Ru), molybdenum (Mo), iridium (Ir), rhodium (Rh), or a combination thereof. In some implementations, the second metal material includes Fe. Co, or B. In some implementations, the conductive layer is formed by a heat treatment on a layer including the first material and a layer including the second material.

In another aspect, an electronic device may include a semiconductor memory, and the semiconductor memory may include a substrate; a magnetic tunnel junction (MTJ) structure which includes a free layer having a variable magnetization direction, a pinned layer having a fixed magnetization direction and a tunnel barrier layer interposed between the free layer and the pinned layer; and an interface layer and a damping constant enhancing layer which are interposed between the tunnel barrier layer and the pinned layer, wherein the damping constant enhancing layer may include a material having a damping constant higher than that of CoFeB.

In another aspect, an electronic device may include a semiconductor memory, and the semiconductor memory may include: a magnetic tunnel junction (MTJ) structure which includes a free layer having a variable magnetization direction, a pinned layer having a fixed magnetization direction and a tunnel barrier layer interposed between the free layer and the pinned layer; a first interface layer and a second interface layer which are interposed between the tunnel barrier layer and the pinned layer; and a damping constant enhancing layer interposed between the first interface layer and the second interface layer, wherein the damping constant enhancing layer may include a material having a damping constant higher than that of CoFeB.

In another aspect, an electronic device may include a semiconductor memory, and the semiconductor memory may include: a magnetic tunnel junction (MTJ) structure which includes a free layer having a variable magnetization direction, a pinned layer having a fixed magnetization direction and a tunnel barrier layer interposed between the free layer and the pinned layer; a mixing layer interposed between the tunnel barrier layer and the pinned layer, wherein the mixing layer may include an alloy-like material in which a material (A) having a damping constant higher than that of CoFeB and a material (B) including Fe, Co, B, or a combination thereof are mixed.

These and other aspects, implementations and associated advantages are described in greater detail in the drawings, the description and the claims.

DETAILED DESCRIPTION

Figure 1:
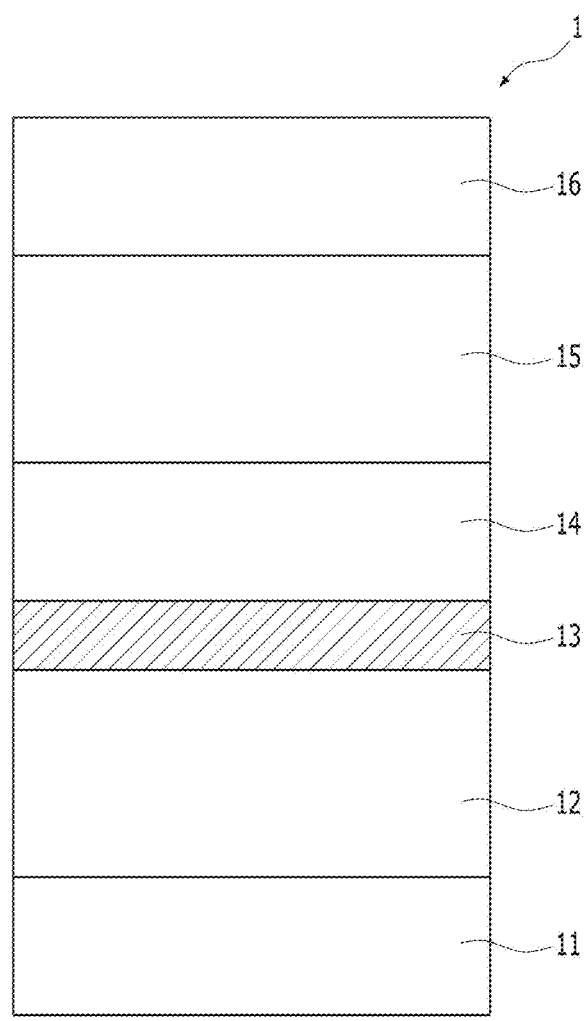
FIG. 1 is a cross-sectional view illustrating an example of a variable resistance element.

Various examples and implementations of the disclosed technology are described below in detail with reference to the accompanying drawings.

The drawings may not be necessarily to scale and in some instances, proportions of at least some of substrates in the drawings may have been exaggerated to illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible.

FIG. 1 is a cross-sectional view illustrating an example of a variable resistance element.

Referring to FIG. 1, an example of a variable resistance element 1 may include a Magnetic Tunnel Junction (MTJ) structure including a free layer 12 having a variable magnetization direction, a pinned layer 15 having a fixed magnetization direction and a tunnel barrier layer 13 interposed between the free layer 12 and the pinned layer 15.

The free layer 12 may have a variable magnetization direction that causes the MTJ structure to have a variable resistance value. The free layer 12 may also be referred as a storage layer.

The pinned layer 15 may have a pinned magnetization direction, which remains unchanged while the magnetization direction of the free layer 12 changes. For this reason, the pinned layer 15 may be referred to as a reference layer.

Depending on a voltage or current applied to the variable resistance element 1, the magnetization direction of the free layer 12 may be changed by spin torque transfer. When the magnetization directions of the free layer 12 and the pinned layer 15 are parallel to each other, the variable resistance element 1 may be in a low resistance state, and this may indicate a digital data bit "0." Conversely, when the magnetization directions of the free layer 12 and the pinned layer 15 are anti-parallel to each other, the variable resistance element 1 may be in a high resistance state, and this may indicate a digital data bit "1." That is, the variable resistance element 1 may function as a memory cell to store a digital data bit based on the orientation of the free layer 12.

The free layer 12 and the pinned layer 15 may have a single-layer or multilayer structure including a ferromagnetic material. The magnetization direction or polarity of the free layer 12 may be changed or flipped between a downward direction and an upward direction. The magnetization direction of the pinned layer 15 may be fixed in a downward direction.

The tunnel barrier layer 13 may allow the tunneling of electrons to change the magnetization direction of the free layer 12. The tunnel barrier layer 13 may include a dielectric oxide.

The variable resistance element 1 may further include one or more layers performing various functions to improve a characteristic of the MTJ structure. For example, the variable resistance element 1 may further include an under layer disposed below the MTJ structure, an interface layer 14 disposed over the tunnel barrier layer 13 and an upper layer 16 disposed over the MTJ structure.

In order to improve a device characteristic and a magnetic characteristic of the variable resistance element 1 including the MTJ structure, it is important to improve an exchange coupling characteristic between the layers included in the variable resistance element 1. The exchange coupling may be a factor that can reduce a stray field and increase a perpendicular magnetic anisotropy (PMA) characteristic. However, in the example of the variable resistance element 1 illustrated in FIG. 1, the exchange coupling is not sufficiently high due to unwanted changes in the magnetization direction of the pinned layer 15 caused by an external magnetic field. The interface layer 14 disposed over the tunnel barrier layer 13 may alleviate this issue, but metal diffusion to the tunnel barrier layer 13 from metal-containing layers disposed adjacent to the tunnel barrier layer 13 may cause the magnetization direction of the pinned layer 15 to become unstable.

A variable resistance element has a structure that exhibits different resistance states or values and is capable of being switched between different resistance states in response to an applied bias (e.g., a current or voltage). A resistance state of such a variable resistance element may be changed by applying a voltage or current of a sufficient magnitude (i.e., a threshold) in a data write operation. The different resistance states of different resistance values of the variable resistance element can be used for representing different data for data storage. Thus, the variable resistance element may store different data according to the resistance state. The variable resistance element may function as a memory cell. The memory cell may further include a selecting element coupled to the variable resistance element and controlling an access to the variable resistance element. Such memory cells may be arranged in various way to form a semiconductor memory.

In some implementations, the variable resistance element may be implemented to include a magnetic tunnel junction (MTJ) structure which includes a free layer having a variable magnetization direction, a pinned layer having a fixed magnetization direction and a tunnel barrier layer interposed therebetween. In response to a voltage or current of a sufficient amplitude applied to the variable resistance element, the magnetization direction of the free layer may be changed to a direction parallel or antiparallel to the magnetization direction of the pinned layer. Thus, the variable resistance element may switch between a low-resistance state and a high-resistance state to thereby store different data based on the different resistance states. The disclosed technology and its implementations can be used to provide an improved variable resistance element capable of satisfying or enhancing various characteristics required for the variable resistance element.

Figure 2:
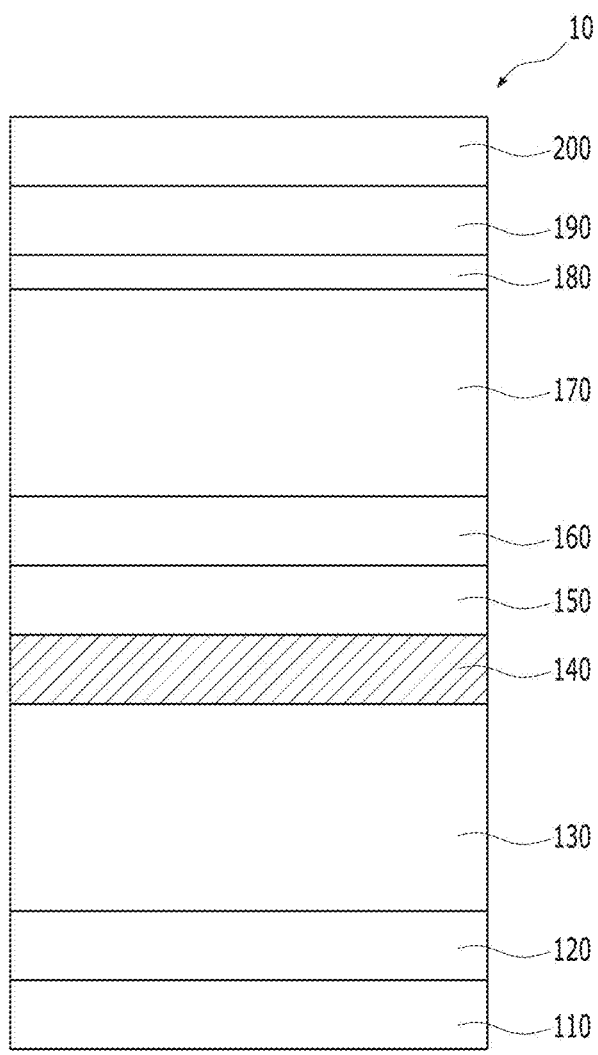
FIG. 2 is a cross-sectional view illustrating an example of a variable resistance element based on some implementations of the disclosed technology.

FIG. 2 is a cross-sectional view illustrating an example of a variable resistance element based on some implementations of the disclosed technology.

In some implementations, a variable resistance element 10 may include an MTJ structure including a free layer 130 having a variable magnetization direction, a pinned layer 170 having a pinned magnetization direction and a tunnel barrier layer 140 interposed between the free layer 130 and the pinned layer 170.

The free layer 130 may have one of different magnetization directions or one of different spin directions of electrons to switch the polarity of the free layer 130 in the MTJ structure, resulting in changes in resistance value. In some implementations, the polarity of the free layer 130 is changed or flipped upon application of a voltage or current signal (e.g., a driving current above a certain threshold) to the MTJ structure. With the polarity changes of the free layer 130, the free layer 130 and the pinned layer 170 have different magnetization directions or different spin directions of electron, which allows the variable resistance element 10 to store different data or represent different data bits. The free layer 130 may also be referred as a storage layer. The magnetization direction of the free layer 130 may be substantially perpendicular to a surface of the free layer 130, the tunnel barrier layer 140 and the pinned layer 170. In other words, the magnetization direction of the free layer 130 may be substantially parallel to stacking directions of the free layer 130, the tunnel barrier layer 140 and the pinned layer 170. Therefore, the magnetization direction of the free layer 130 may be changed between a downward direction and an upward direction. The change in the magnetization direction of the free layer 130 may be induced by a spin transfer torque generated by an applied current or voltage.

The free layer 130 may have a single-layer or multilayer structure including a ferromagnetic material. For example, the free layer 130 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or others, or may include a stack of metals, such as Co/Pt, or Co/Pd, or others.

The tunnel barrier layer 140 may allow the tunneling of electrons in both data reading and data writing operations. In a write operation for storing new data, a high write current may be directed through the tunnel barrier layer 140 to change the magnetization direction of the free layer 130 and thus to change the resistance state of the MTJ for writing a new data bit. In a reading operation, a low reading current may be directed through the tunnel barrier layer 140 without changing the magnetization direction of the free layer 130 to measure the existing resistance state of the MTJ under the existing magnetization direction of the free layer 130 to read the stored data bit in the MTJ. The tunnel barrier layer 140 may include a dielectric oxide such as MgO, CaO, SrO, TiO, VO, or NbO or others.

The pinned layer 170 may have a pinned magnetization direction, which remains unchanged while the magnetization direction of the free layer 130 changes. The pinned layer 170 may be referred to as a reference layer. In some implementations, the magnetization direction of the pinned layer 170 may be pinned in a downward direction. In some implementations, the magnetization direction of the pinned layer 170 may be pinned in an upward direction.

The pinned layer 170 may have a single-layer or multilayer structure including a ferromagnetic material. For example, the pinned layer 170 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or may include a stack of metals, such as Co/Pt, or Co/Pd or others.

If a voltage or current is applied to the variable resistance element 10, the magnetization direction of the free layer 130 may be changed by spin torque transfer. In some implementations, when the magnetization directions of the free layer 130 and the pinned layer 170 are parallel to each other, the variable resistance element 10 may be in a low resistance state, and this may indicate digital data bit "0." Conversely, when the magnetization directions of the free layer 130 and the pinned layer 170 are anti-parallel to each other, the variable resistance element 10 may be in a high resistance state, and this may indicate a digital data bit "1." In some implementations, the variable resistance element 10 can be configured to store data bit '1' when the magnetization directions of the free layer 130 and the pinned layer 170 are parallel to each other and to store data bit '0' when the magnetization directions of the free layer 130 and the pinned layer 170 are anti-parallel to each other.

In some implementations, the variable resistance element 10 may further include one or more layers performing various functions to improve a characteristic of the MTJ structure. For example, the variable resistance element 10 may further include at least one of a buffer layer 110, an under layer 120, an interface layer 150, a damping constant enhancing layer 160, a spacer layer 180, a magnetic correction layer 190 and a capping layer 200.

The under layer 120 may be disposed under the free layer 130 and serve to improve perpendicular magnetic crystalline anisotropy of the free layer 130. The under layer 120 may have a single-layer or multilayer structure including a metal, a metal alloy, a metal nitride, or a metal oxide, or a combination thereof.

The buffer layer 110 may be disposed below the under layer 120 to facilitate crystal growth of the under layer 120, thus improving perpendicular magnetic crystalline anisotropy of the free layer 130. The buffer layer 110 may have a single-layer or multilayer structure including a metal, a metal alloy, a metal nitride, or a metal oxide, or a combination thereof. Moreover, the buffer layer 110 may be formed of or include a material having a good compatibility with a bottom electrode (not shown) in order to resolve the lattice constant mismatch between the bottom electrode and the under layer 120. For example, the buffer layer 110 may include tantalum (Ta).

The capping layer 200 may function as a hard mask for patterning the variable resistance element 10. In some implementations, the capping layer 200 may include various conductive materials such as a metal. In some implementations, the capping layer 200 may include a metallic material having almost none or a small number of pin holes and high resistance to wet and/or dry etching. In some implementations, the capping layer 200 may include a metal, a nitride or an oxide, or a combination thereof. For example, the capping layer 200 may include a noble metal such as ruthenium (Ru).

The magnetic correction layer 190 may serve to offset the effect of the stray magnetic field produced by the pinned layer 170. In this case, the effect of the stray magnetic field of the pinned layer 170 can decrease, and thus a biased magnetic field in the free layer 130 can decrease. The magnetic correction layer 190 may have a magnetization direction anti-parallel to the magnetization direction of the pinned layer 170. In the implementation, when the pinned layer 170 has a downward magnetization direction, the magnetic correction layer 190 may have an upward magnetization direction. Conversely, when the pinned layer 170 has an upward magnetization direction, the magnetic correction layer 190 may have a downward magnetization direction. The magnetic correction layer 190 may be exchange coupled with the pinned layer 170 via the spacer layer 180 to form a synthetic anti-ferromagnet (SAF) structure. The magnetic correction layer 190 may have a single-layer or multilayer structure including a ferromagnetic material.

In this implementation, the magnetic correction layer 190 is located above the pinned layer 170, but the magnetic correction layer 190 may disposed at a different location. For example, the magnetic correction layer 190 may be located above, below, or next to the MTJ structure while the magnetic correction layer 190 is patterned separately from the MTJ structure.

A material layer (not shown) for resolving the lattice structure differences and the lattice constant mismatch between the pinned layer 170 and the magnetic correction layer 190 may be interposed between the pinned layer 170 and the magnetic correction layer 190. For example, this material layer may be amorphous and may include a metal a metal nitride, or metal oxide.

The spacer layer 180 may be interposed between the magnetic correction layer 190 and the pinned layer 170 and function as a buffer between the magnetic correction layer 190 and the pinned layer 170. The spacer layer 180 may serve to improve characteristics of the magnetic correction layer 190. The spacer layer 180 may include a noble metal such as ruthenium (Ru).

The interface layer 150 may serve to block diffusion of metals contained in the layers disposed over the interface layer 150 to the tunnel barrier layer 140 and prevent the crystallinity from affecting the pinned layer 170 during crystal growth of the tunnel barrier layer 140. Further, the interface layer 150 may be coupled with the pinned layer 170 to strengthen the exchange coupling, thereby avoiding switching of the magnetization direction of the pinned layer 170.

The interface layer 150 may include an alloy based on Fe, Co, B or a combination thereof, for example, an Fe—Co—B alloy.

The damping constant enhancing layer 160 may be interposed between the interface layer 150 and the pinned layer 170. The damping constant enhancing layer 160 may serve to increase a damping constant (a) of the interface layer 150 and the pinned layer 170 to prevent switching of the magnetization direction of the pinned layer 170. Moreover, the damping constant enhancing layer 160 may also be structured to prevent metal diffusion from the layers disposed over the damping constant enhancing layer 160 to the tunnel barrier layer 140. By using the damping constant enhancing layer 160, the tunnel barrier layer 140 and the pinned layer 170 may have a strong exchange coupling. Therefore, it is possible to decrease a stray field and form a strong perpendicular magnetic anisotropy (PMA) which can withstand the external magnetic field. As a result, an electrical characteristic of the variable resistance element 10 can be improved.

The damping constant enhancing layer 160 may include a material which has a high damping constant, for example, a damping constant higher than that of a magnetic material including Co, Fe, and B (e.g., CoFeB) so as to suppress switching of the magnetization direction of the pinned layer 170. Further, the damping constant enhancing layer 160 may include a material that can prevent metal diffusion from the layers disposed over the damping constant enhancing layer 160 to the tunnel barrier layer 140 and suppress switching of the magnetization direction of the pinned layer 170.

In some implementations, the damping constant enhancing layer 160 may include a heavy metal. The heavy metal has a higher damping constant than normal metals. Accordingly, by using the damping constant enhancing layer 160 including the heavy metal, it is possible to form a strong exchange coupling, thereby improving a PMA characteristic.

The damping constant enhancing layer 160 may include at least one of tungsten (W), ruthenium (Ru), molybdenum (Mo), iridium (Ir), rhodium (Rh), or a combination thereof.

In an implementation, the interface layer 150 and the damping constant enhancing layer 160 may be mixed by heat treatment after deposition to form a mixing layer which is a conductive layer and includes two or more different metal materials to form an alloy-like material. This will be described in detail with reference to FIG. 3.

Figure 3:
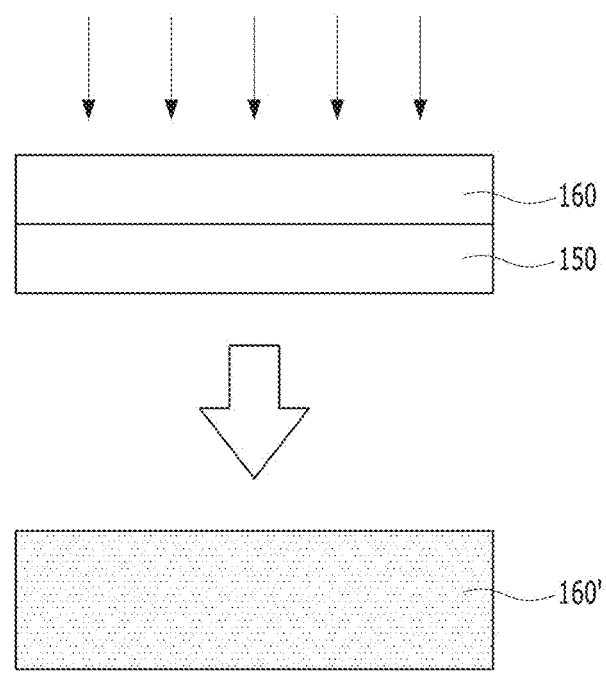
FIG. 3 is a cross-sectional view illustrating an example method for forming a mixing layer of another exemplary variable resistance element based on some implementations of the disclosed technology.

FIG. 3 is a cross-sectional view illustrating an example method for forming a mixing layer for use in another example of the variable resistance element based on some implementations of the disclosed technology. The following descriptions will be focused on features different from those discussed with respect to FIG. 2.

Referring to FIG. 3, the interface layer 150 and the damping constant enhancing layer 160 may be formed over a structure in which a predetermined structure (not shown) is formed. In some implementations, the predetermined structure may include, for example, the buffer layer 110, the under layer 120, the free layer 130 and the tunnel barrier layer 140, which are sequentially formed as shown in FIG. 2. Then, by performing a heat treatment on the resultant structure in which the interface layer 150 and the damping constant enhancing layer 160 are formed, the interface layer 150 and the damping constant enhancing layer 160 may be mixed to form a mixing layer 160'.

The mixing layer 160' may include an alloy or alloy-like material formed by mixing a material included in the interface layer 150 with a material included in the damping constant enhancing layer 160. The material included in the interface layer 150 and the material included in the damping constant enhancing layer 160 may be identical or similar to those described with reference to the implementation shown in FIG. 2. As such, this mixing layer can function as a combination of an interface layer and a damping constant enhancing layer.

After forming the mixing layer 160', as shown in FIG. 2, the pinned layer 170, the spacer layer 180, the magnetic correction layer 190 and the capping layer 200 may be formed.

Figure 4:
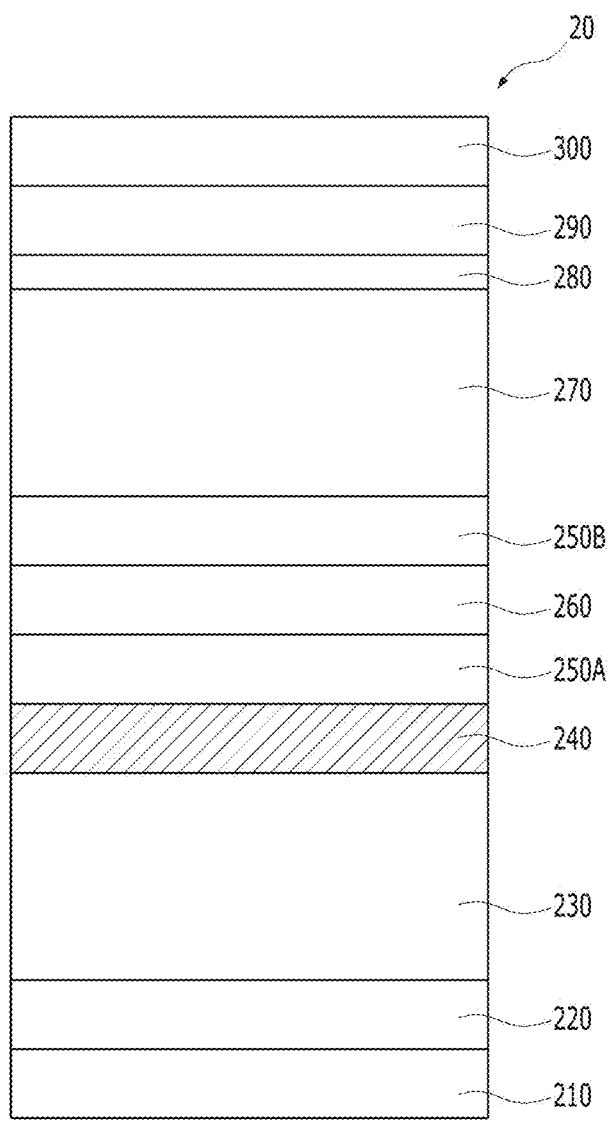
FIG. 4 is a cross-sectional view illustrating another example of a variable resistance element based on some implementations of the disclosed technology.

FIG. 4 is a cross-sectional view illustrating another exemplary variable resistance element based on some implementations of the disclosed technology. The following descriptions will be focused on features different from those discussed with respect to FIG. 2.

In some implementations, unlike the variable resistance element 10 shown in FIG. 2, a variable resistance element 20 shown in FIG. 4 includes a first interface layer 250A, a damping constant enhancing layer 260 and a second interface layer 250B instead of interface layer 150 and the damping constant enhancing layer 160. As an example, the damping constant enhancing layer 260 may be interposed between the first interface layer 250A disposed over a tunnel barrier layer 240 and the second interface layer 250B disposed under a pinned layer 270.

The first interface layer 250A and the second interface layer 250B may serve to block diffusion of metal ions and/or atoms contained in the layers disposed over the first interface layer 250A and the second interface layer 250B to the tunnel barrier layer 240 and prevent a particular crystalline structure of the tunnel barrier layer 240 from affecting a pinned layer 270 during crystal growth process of the tunnel barrier layer 240. Further, the first interface layer 250A and the second interface layer 250B may be coupled with the pinned layer 270 to strengthen the exchange coupling, thereby avoiding switching of the magnetization direction of the pinned layer 270.

Each of the first interface layer 250A and the second interface layer 250B may include an alloy based on Fe, Co, B or a combination thereof, for example, an Fe—Co—B alloy.

The damping constant enhancing layer 260 may be interposed between the first interface layer 250A and the second interface layer 250B. The damping constant enhancing layer 260 may serve to increase a damping constant (a) of the first interface layer 250A, the second interface layer 250B and the pinned layer 270 to prevent switching of the magnetization direction of the pinned layer 270. Moreover, the damping constant enhancing layer 260 may prevent metal diffusion from the layers disposed over the damping constant enhancing layer 260 to the tunnel barrier layer 240. By using the damping constant enhancing layer 260, the tunnel barrier layer 240 and the pinned layer 270 may have a strong exchange coupling. Therefore, it is possible to decrease a stray field and form a strong perpendicular magnetic anisotropy (PMA) which can withstand the external magnetic field. As a result, an electrical characteristic of the variable resistance element 20 can be improved.

The damping constant enhancing layer 260 may include a material that has a high damping constant, for example, a damping constant higher than that of a magnetic material including Co, Fe, and B (e.g., CoFeB) so as to suppress switching of the magnetization direction of the pinned layer 270. Further, the damping constant enhancing layer 260 may include a material which can prevent metal diffusion from the layers disposed over the damping constant enhancing layer 260 to the tunnel barrier layer 240 and suppress switching of the magnetization direction of the pinned layer 270.

In some implementations, the damping constant enhancing layer 260 may include a heavy metal. The heavy metal has a higher damping constant than normal metals. Accordingly, by using the damping constant enhancing layer 260 including the heavy metal, it is possible to form a strong exchange coupling, thereby improving a PMA characteristic.

The damping constant enhancing layer 260 may include at least one of tungsten (W), ruthenium (Ru), molybdenum (Mo), iridium (Ir), rhodium (Rh), or a combination thereof.

In some implementations, the first interface layer 250A, the second interface layer 250B and the damping constant enhancing layer 260 may be mixed by heat treatment after a deposition process to form a mixing layer including an alloy-like material.

In this implementation, by including the first interface layer 250A, the second interface layer 250B and the damping constant enhancing layer 260 interposed between the first interface layer 250A and the second interface layer 250B, metal diffusion to the tunnel barrier layer 240 may be prevented more effectively and exchange coupling may be improved (due to the increased damping constant), as compared to a single interface layer. Therefore, an undesirable switching of the magnetization direction of the pinned layer 270 that may occur due to the external magnetic field can be avoided, thereby improving a PMA characteristic. As a result, device characteristics of the variable resistance element 20 can be further enhanced.

A buffer layer 210, an under layer 220, a free layer 230, a tunnel barrier layer 240, a pinned layer 270, a spacer layer 280, a magnetic correction layer 290 and a capping layer 300 shown in FIG. 4 may be identical or similar to the buffer layer 110, the under layer 1203, the free layer 130, the tunnel barrier layer 140, the pinned layer 170, the spacer layer 180, the magnetic correction layer 190 and the capping layer 200, respectively.

In some implementations, the first interface layer 250A, the second interface layer 250B and the damping constant enhancing layer 260 may be mixed by heat treatment after deposition to form a mixing layer which includes an alloy-like material. This will be described in detail with reference to FIG. 5.

Figure 5:
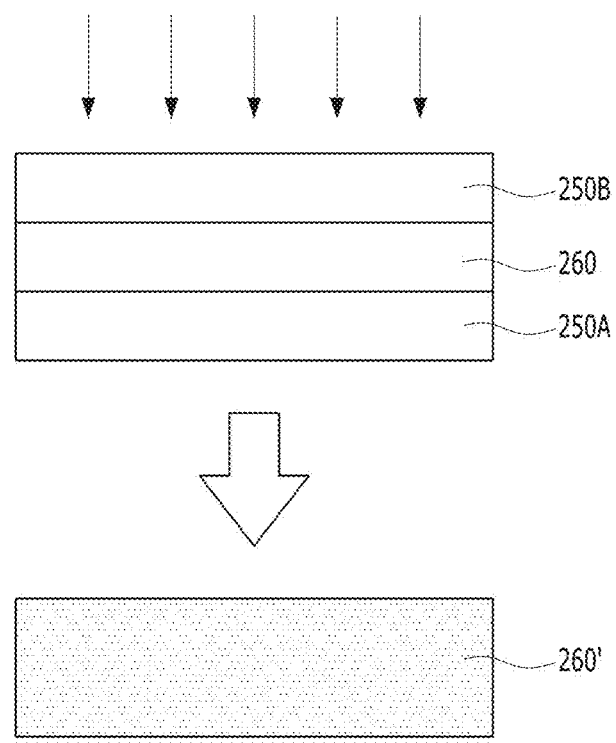
FIG. 5 is a cross-sectional view illustrating an example method for forming a mixing layer of another example of the variable resistance element based on some implementations of the disclosed technology.

FIG. 5 is a cross-sectional view illustrating an example method for forming a mixing layer of another example of the variable resistance element based on some implementations of the disclosed technology. The following descriptions will be focused on features different from those discussed with respect to FIG. 4.

Referring to FIG. 5, the first interface layer 250A, the damping constant enhancing layer 260 and the second interface layer 250B may be formed over a structure in which a predetermined structure (not shown) is formed. In some implementations, the predetermined structure may include, for example, the buffer layer 210, the under layer 220, the free layer 230 and the tunnel barrier layer 240, which are sequentially formed as shown in FIG. 4. Then, by performing a heat treatment on the resultant structure in which the first interface layer 250A, the damping constant enhancing layer 260 and the second interface layer 250B are formed, the first interface layer 250A, the damping constant enhancing layer 260 and the second interface layer 250 may be mixed to form a mixing layer 260'.

The mixing layer 260' may include an alloy or alloy-like material which is formed by mixing a material included in the first interface layer 250A and a material included in the second interface layer 250B with a material included in the damping constant enhancing layer 260. The materials included in the first interface layer 250A and the second interface layer 250B and the materials included in the damping constant enhancing layer 260 may be identical or similar to those described with reference to the implementation shown in FIG. 4.

After forming the mixing layer 260', as shown in FIG. 4, the pinned layer 270, the spacer layer 280, the magnetic correction layer 290 and the capping layer 300 may be formed.

Figure 6:
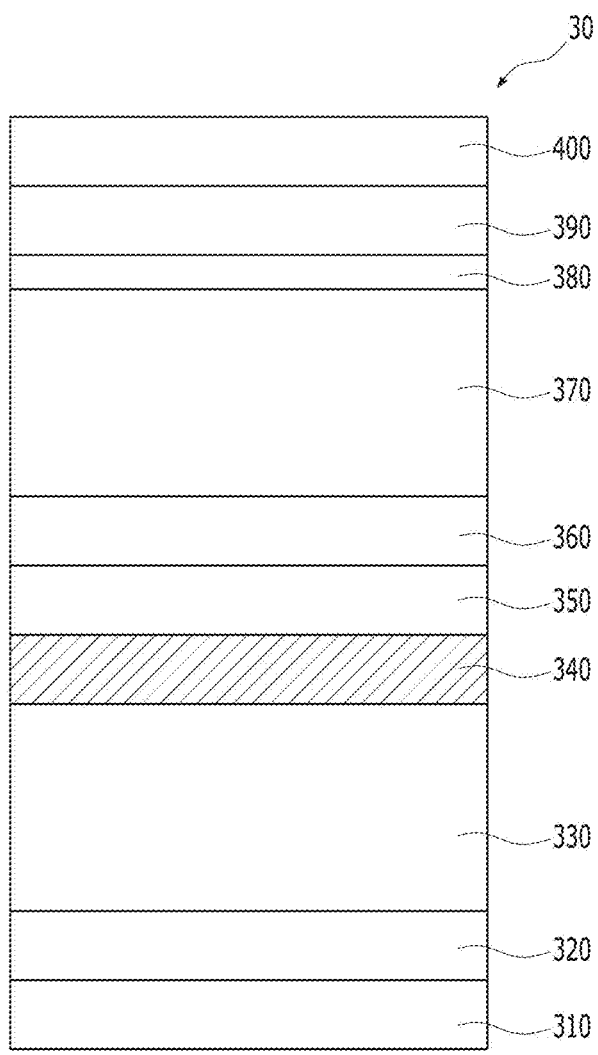
FIG. 6 is a cross-sectional view illustrating further another example of the variable resistance element based on some implementations of the disclosed technology.

FIG. 6 is a cross-sectional view illustrating further another example of the variable resistance element based on some implementations of the disclosed technology. The following descriptions will be focused on features different from those discussed with respect to FIG. 2.

In some implementations, unlike the variable resistance element 10 shown in FIG. 2, a variable resistance element 30 shown in FIG. 6 includes a damping constant enhancing layer 350 and an interface layer 360 disposed over the damping constant enhancing layer 350 instead of interface layer 150 and the damping constant enhancing layer 160 disposed over the interface layer 150. As an example, the damping constant enhancing layer 350 may be disposed over a tunnel barrier layer 340 and the interface layer 360 may be disposed over the damping constant enhancing layer 350.

The interface layer 360 may serve to block diffusion of metal ions and/or atoms contained in the layers disposed over the interface layer 360 to the tunnel barrier layer 340 and prevent a particular crystalline structure of the tunnel barrier layer 340 from affecting a pinned layer 370 during crystal growth process of the tunnel barrier layer 340. Further, the interface layer 360 may be coupled with the pinned layer 370 to strengthen the exchange coupling, thereby avoiding switching of the magnetization direction of the pinned layer 370.

The interface layer 360 may include an alloy based on Fe, Co, B or a combination thereof, for example, an Fe—Co—B alloy.

The damping constant enhancing layer 350 may be interposed between the tunnel barrier layer 340 and the interface layer 360. The damping constant enhancing layer 350 may serve to increase a damping constant (a) of the interface layer 360 and the pinned layer 370 to prevent switching of the magnetization direction of the pinned layer 370. Moreover, the damping constant enhancing layer 350 may prevent metal diffusion from the layers disposed over the damping constant enhancing layer 350 to the tunnel barrier layer 340. By using the damping constant enhancing layer 350, the tunnel barrier layer 340 and the pinned layer 370 may have a strong exchange coupling. Therefore, it is possible to decrease a stray field and form a strong perpendicular magnetic anisotropy (PMA) which can withstand the external magnetic field. As a result, an electrical characteristic of the variable resistance element 30 can be improved.

The damping constant enhancing layer 350 may include a material having a high damping constant to increase a damping constant of the pinned layer 370, for example, a damping constant higher than that of a magnetic material including Co, Fe, and B (e.g., CoFeB). Further, the damping constant enhancing layer 350 may include a material that can prevent metal diffusion from the layers disposed over the damping constant enhancing layer 350 to the tunnel barrier layer 340 and suppress switching of the magnetization direction of the pinned layer 370.

In some implementations, the damping constant enhancing layer 350 may include a heavy metal. The heavy metal has a higher damping constant than normal metals. Accordingly, by using the damping constant enhancing layer 350 including the heavy metal, it is possible to form a strong exchange coupling, thereby improving a PMA characteristic.

The damping constant enhancing layer 350 may include at least one of tungsten (W), ruthenium (Ru), molybdenum (Mo), iridium (Ir), rhodium (Rh), or a combination thereof in consideration of improving characteristics.

In some implementations, the interface layer 360 and the damping constant enhancing layer 350 may be mixed by heat treatment after a deposition process to form a mixing layer including an alloy-like material. This will be described in detail with reference to FIG. 7.

Figure 7:
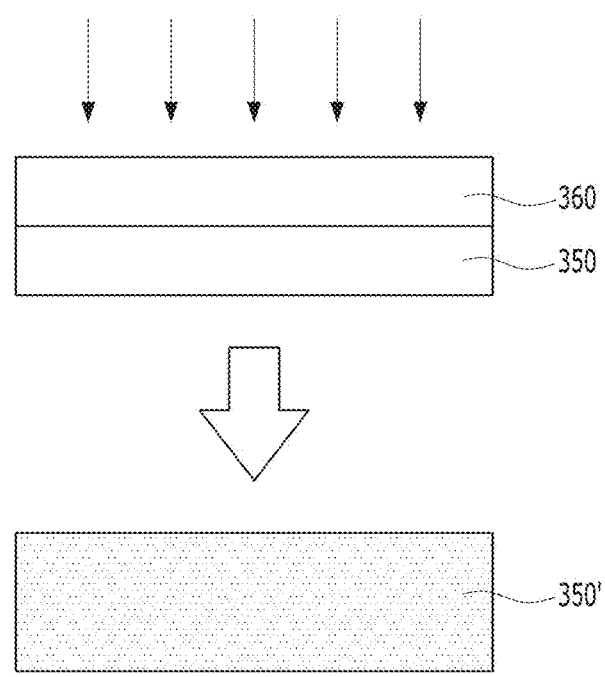
FIG. 7 is a cross-sectional view illustrating an example method for forming a mixing layer of another example of the variable resistance element based on some implementations of the disclosed technology.

FIG. 7 is a cross-sectional view illustrating an example method for forming a mixing layer of another example of the variable resistance element based on some implementations of the disclosed technology.

Referring to FIG. 7, the damping constant enhancing layer 350 and the interface layer 360 may be formed over a structure in which a predetermined structure (not shown) is formed. In some implementations, the predetermined structure may include, for example, the buffer layer 310, the under layer 320, the free layer 330 and the tunnel barrier layer 340, which are sequentially formed as shown in FIG. 6. Then, by performing a heat treatment on the resultant structure in which the damping constant enhancing layer 350 and the interface layer 360 are formed, the damping constant enhancing layer 350 and the interface layer 360 may be mixed to form a mixing layer 350'.

The mixing layer 350' may include an alloy or alloy-like material formed by mixing a material included in the damping constant enhancing layer 350 with a material included in the interface layer 360. The material included in the damping constant enhancing layer 350 and the material included in the interface layer 360 are identical or similar to those described with reference to the implementation shown in FIG. 6.

After forming the mixing layer 350', as shown in FIG. 6, the pinned layer 370, the spacer layer 380, the magnetic correction layer 390 and the capping layer 400 may be formed.

In the variable resistance elements 10, 20 and 30 based on the implementations shown in FIGS. 2, 4 and 6, the free layers 130, 230 and 330 are formed below the pinned layers 170, 270 and 370, respectively. In another implementation, the free layers 130, 230 and 330 may be formed over the pinned layers 170, 270 and 370, respectively.

Effects of the implementations of the disclosed technology will be described in detail with reference to FIG. 8.

Figure 8:
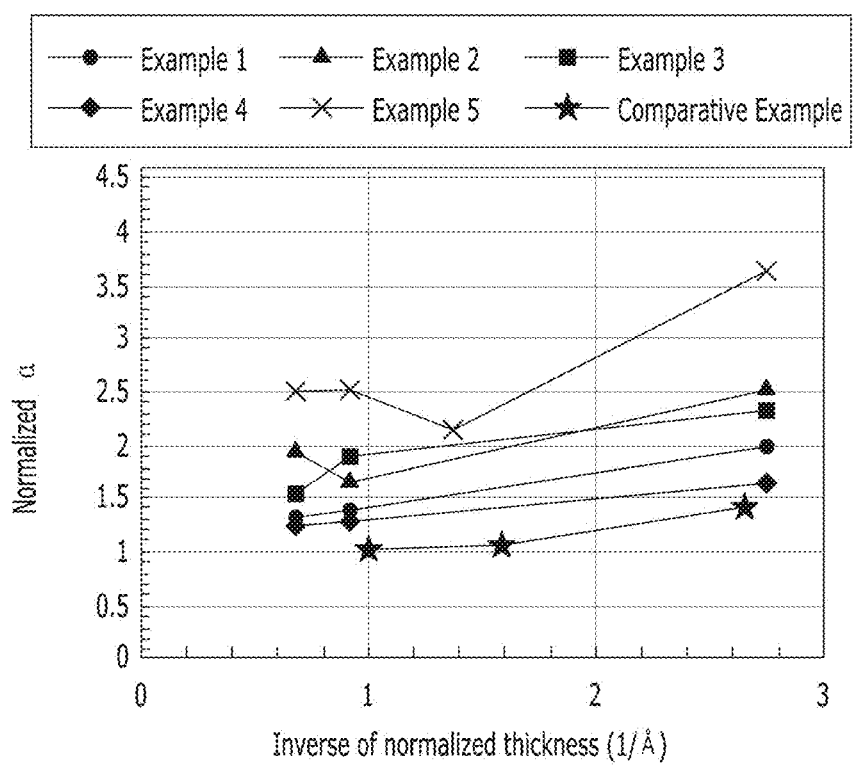
FIG. 8 is a graph illustrating a damping constant (a) of a pinned layer depending on materials used for variable resistance elements based on some implementations of the disclosed technology and a comparative example, respectively.

FIG. 8 is a graph illustrating a damping constant (a) of a pinned layer depending on materials used for variable resistance elements based on some implementations of the disclosed technology and a comparative example, respectively.

In FIG. 8, a damping constant (a) of the pinned layer 270 of the variable resistance element 20 shown in FIG. 4 is indicated. The first interface layer 250A and the second interface layer 250B include a CoFeB alloy and the damping constant enhancing layer 260 includes a material as follows: Example 1-tungsten (W), Example 2-ruthenium (Ru), Example 3-molybdenum (Mo), Example 4-iridium (Ir) and Example 5-rhodium (Rh). In Comparative example, a single interface layer is included instead of the first interface layer 250A, the damping constant enhancing layer 260 and the second interface layer 250B and no damping constant enhancing layer is included. In FIG. 8, a vertical axis represents the normalized damping constant (a) of the pinned layer 270 and a horizontal axis represents the inverse of the normalized thickness of the free layer 230, that is, the normalized value of 1/thickness of the free layer 230 (1/Å).

Referring to FIG. 8, in comparison with Comparative example which does not include the damping constant enhancing layer 260, in case of Examples 1 to 5 including the damping constant enhancing layer 260, a damping constant of the pinned layer 270 is higher over the entire region of the thickness of the free layer 230. Therefore, it is shown that, by using the damping constant enhancing layer 260, a switching current (Ic) characteristic of the pinned layer 270 can be improved to suppress switching of the magnetization direction of the pinned layer 270 according to the external magnetic field. Further, it is also shown that the exchange coupling is enhanced to exhibit a good PMA characteristic and reduce a stray field. Moreover, it is possible to suppress metal diffusion to the tunnel barrier layer 240. Accordingly, an electrical characteristic of the variable resistance element 20 can be remarkably improved.

The variable resistance elements 10 and 30 may also have the same effect as the variable resistance element 20.

Figure 9:
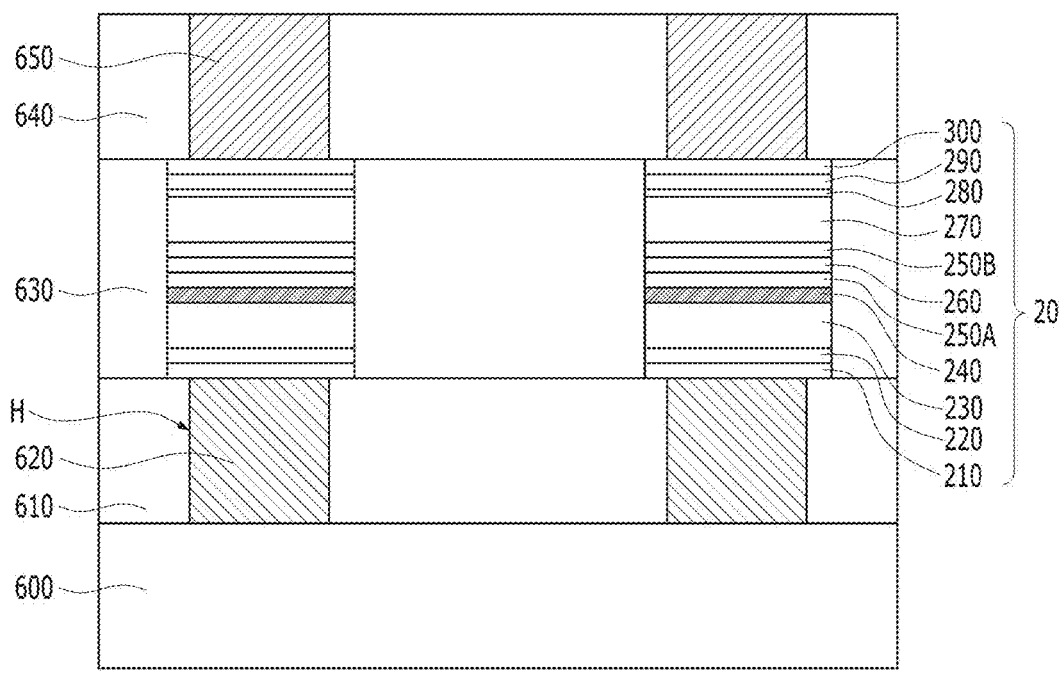
FIG. 9 is a cross-sectional view illustrating an example of a memory device and an example method for fabricating the memory device based on some implementations of the disclosed technology.
Figure 10:
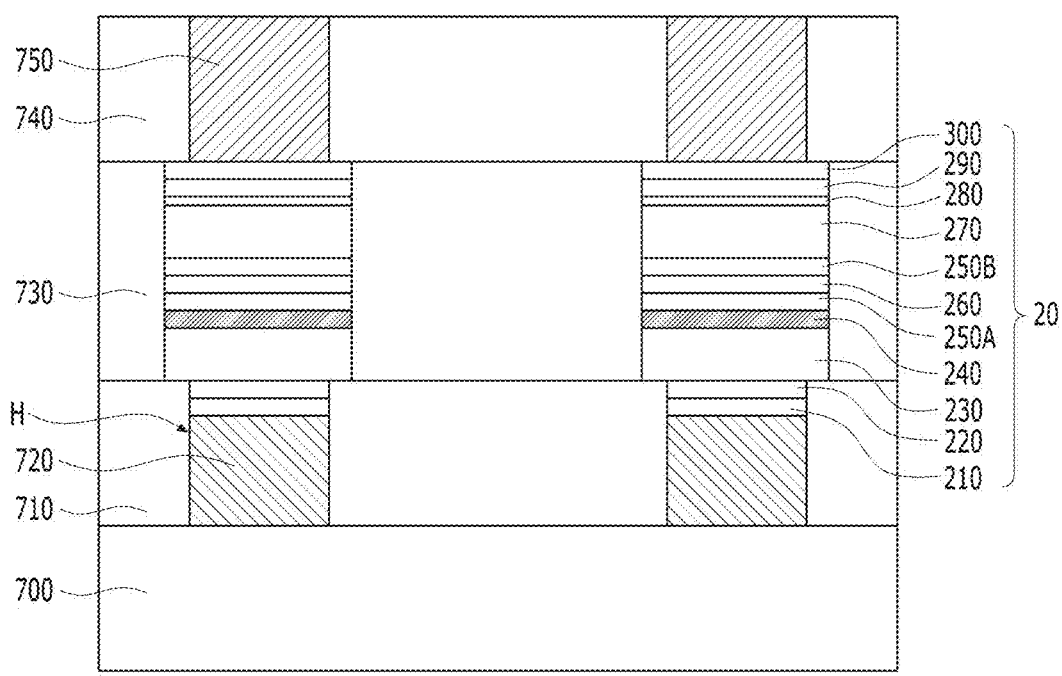
FIG. 10 is a cross-sectional view illustrating another example of the memory device and a method for fabricating the memory device based on some implementations of the disclosed technology.

A semiconductor memory device as disclosed in this document may include a cell array of variable resistance elements 10, 20 and 30 to store data. The semiconductor memory may further include various components such as lines, elements, etc. to drive or control each of the variable resistance elements 10, 20 and 30. This is exemplarily explained with reference to FIGS. 9 and 10. In FIGS. 9 and 10, the variable resistance element 20 shown in FIG. 4 is explained. The similar explanation can be applied to the variable resistance element 10 and 30 shown in FIGS. 2 and 6, respectively.

FIG. 9 is a cross-sectional view for explaining an example of a memory device and an example method for fabricating the memory device based on some implementations of the disclosed technology.

Referring to FIG. 9, the memory device of the implementation may include a substrate 600, lower contacts 620 formed over the substrate 600, variable resistance element 20 formed over the lower contacts 620 and upper contacts 650 formed over the variable resistance element 20. For each variable resistance element 20, a specific structure as a switch or switching circuit/element, for example, a transistor, for controlling an access to a particular variable resistance element 20 can be provided over the substrate 600 to control the variable resistance element 20, where the switch can be turned on to select the variable resistance element 20 or turned off to de-select the variable resistance element 20. The lower contacts 620 may be disposed over the substrate 600, and couple a lower end of the variable resistance element 20 to a portion of the substrate 600, for example, a drain of the transistor as the switching circuit for the variable resistance element 20. The upper contact 650 may be disposed over the variable resistance element 20, and couple an upper end of the variable resistance element 20 to a certain line (not shown), for example, a bit line. In FIG. 9, two variable resistance elements 20 are shown as examples of the elements in an array of variable resistance elements 20.

First, the substrate 600 in which the transistor is formed may be provided, and then, a first interlayer dielectric layer 610 may be formed over the substrate 600. Then, the lower contact 620 may be formed by selectively etching the first interlayer dielectric layer 610 to form a hole H exposing a portion of the substrate 600 and filling the hole H with a conductive material. Then, the variable resistance element 20 may be formed by forming material layers for the variable resistance element 20 over the first interlayer dielectric layer 610 and the lower contact 620, and selectively etching the material layers. The etch process for forming the variable resistance element 20 may include the IBE method which has a strong physical etching characteristic. Then, a second interlayer dielectric layer 630 may be formed to cover the variable resistance element 20. Then, a third interlayer dielectric layer 640 may be formed over the variable resistance element 20 and the second interlayer dielectric layer 630, and then upper contacts 650 passing through the third interlayer dielectric layer 640 and coupled to an upper end of the variable resistance element 20 may be formed.

In the memory device based on this implementation, all layers forming the variable resistance element 20 may have sidewalls which are aligned with one another. That is because the variable resistance element 20 is formed through an etch process using one mask.

Unlike the implementation of FIG. 9, a part of the variable resistance element 20 may be patterned separately from other parts. This process is illustrated in FIG. 10.

FIG. 10 is a cross-sectional view for explaining a memory device and a method for fabricating the memory device based on another implementation of the present disclosure. The following descriptions will be focused on features difference from those discussed with respect to FIG. 9.

Referring to FIG. 10, the memory device based on this implementation may include a variable resistance element 20 of which parts, for example, a buffer layer 210 and an under layer 220 have sidewalls that are not aligned with other layers thereof. As shown in FIG. 9, the buffer layer 210 and the under layer 220 may have sidewalls which are aligned with lower contacts 720.

The memory device in FIG. 8 may be fabricated by following processes.

First, a first interlayer dielectric layer 710 may be formed over a substrate 700, and then selectively etched to form a hole H exposing a portion of the substrate 700. The, the lower contacts 720 may be formed to fill a lower portion of the hole H. For example, the lower contacts 720 may be formed through a series of processes of forming a conductive material to cover the resultant structure having the hole formed therein, and removing a part of the conductive material through an etch back process until the conductive material has a desired thickness. Then, the buffer layer 210 and the under layer 220 may be formed so as to fill the remaining portion the hole H. For example, the buffer layer 210 may be formed by forming a material layer for forming the buffer layer 210 which covers the resultant structure in which the lower contacts 720 is formed, and then removing a portion of the material layer by, for example, an etch-back process until the material layer has a desired thickness. Moreover, the under layer 220 may be formed by forming a material layer for forming the under layer 220 which covers the resultant structure in which the lower contacts 720 and the buffer layer 210 are formed, and then performing a planarization process such as a CMP (Chemical Mechanical Planarization) until a top surface of the first interlayer dielectric layer 710 is exposed. Then, the remaining parts of the variable resistance element 20 may be formed by forming material layers for forming the remaining layers of the variable resistance element 20 except the buffer layer 210 and the under layer 220 over the lower contacts 720 and the first interlayer dielectric layer 710.

Subsequent processes are substantially the same as those as shown in FIG. 9.

In this implementation, the height which needs to be etched at a time in order to form the variable resistance element 20 can be reduced, which makes it possible to lower the difficulty level of the etch process.

Although in this implementation, the buffer layer 210 and the under layer 220 are buried in the hole H, other parts of the variable resistance element 10 may also be buried as needed.

The above and other memory circuits or semiconductor devices based on the disclosed technology can be used in a range of devices or systems. FIGS. 11 to 15 provide some examples of devices or systems that can implement the memory circuits disclosed herein.

Figure 11:
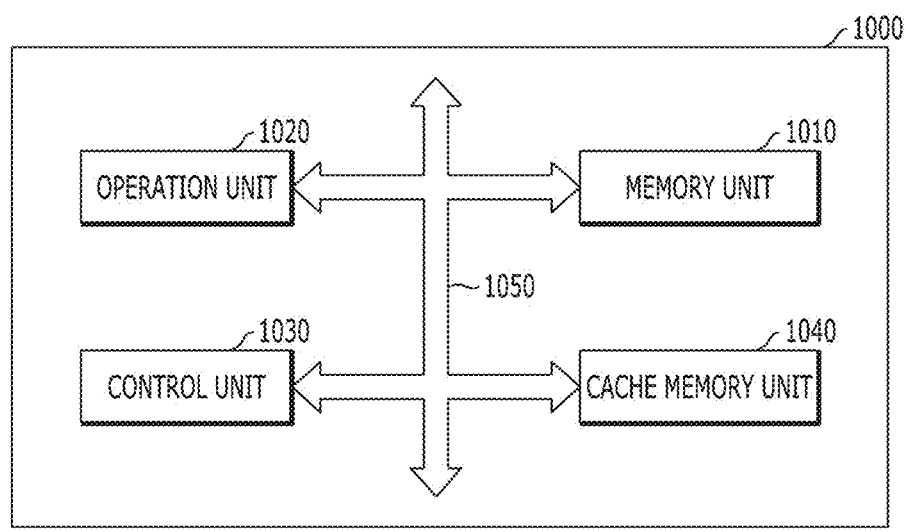
FIG. 11 is an example configuration diagram of a microprocessor including memory circuitry based on an implementation of the disclosed technology.

FIG. 11 is an example configuration diagram of a microprocessor including memory circuitry based on the disclosed technology.

Referring to FIG. 11, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing circuits such as a central processing unit (CPU), a graphic processing unit (GPU), a digital signal processor (DSP) and an application processor (AP).

The memory unit 1010 is a part which stores data in the microprocessor 1000, as a processor, register. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices based on the implementations. For example, the memory unit 1010 may include a substrate; a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and an interface layer and a damping constant enhancing layer interposed between the tunnel barrier layer and the pinned layer, wherein the interface layer may be structured to reduce metal diffusion and the damping constant enhancing layer includes a material having a relatively high damping constant to suppress switching of the magnetization direction of the pinned layer. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 12:
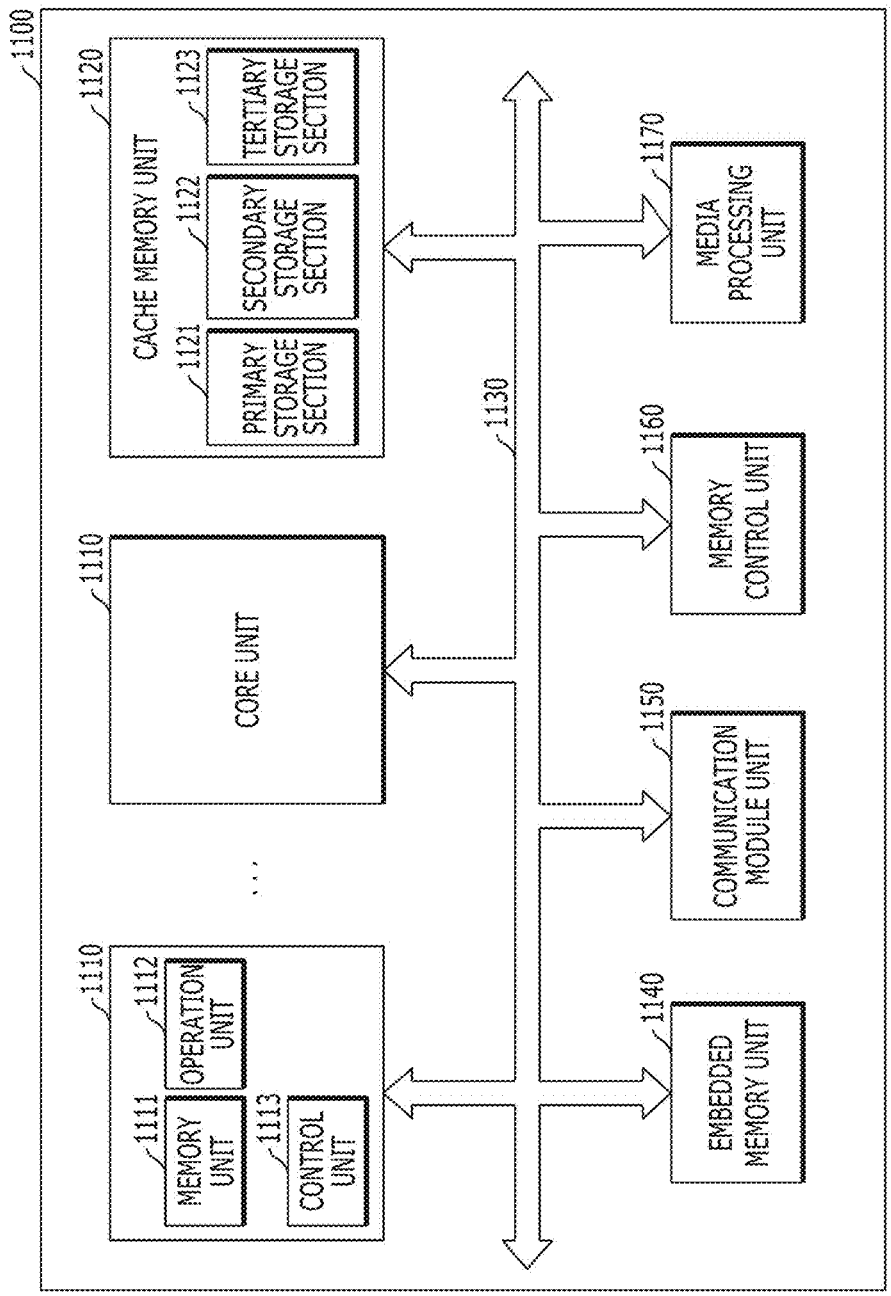
FIG. 12 is an example configuration diagram of a processor including memory circuitry based on an implementation of the disclosed technology.

FIG. 12 is an example configuration diagram of a processor including memory circuitry based on an implementation of the disclosed technology.

Referring to FIG. 12, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is operable to perform arithmetic logic operations for data inputted from an external device, and may include a memory unit 1111, an operation unit 1112 and a control unit 1113.

The memory unit 1111 is operable to store data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is configured to perform operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is operable to temporarily store data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices based on the implementations. For example, the cache memory unit 1120 may include a substrate; a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and an interface layer and a damping constant enhancing layer interposed between the tunnel barrier layer and the pinned layer, wherein the interface layer may be structured to reduce metal diffusion and the damping constant enhancing layer includes a material having a relatively high damping constant to suppress switching of the magnetization direction of the pinned layer. Through this, data storage characteristics of the cache memory unit 1120 may be improved. As a consequence, operating characteristics of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is operable to connect the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit circuit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 13:
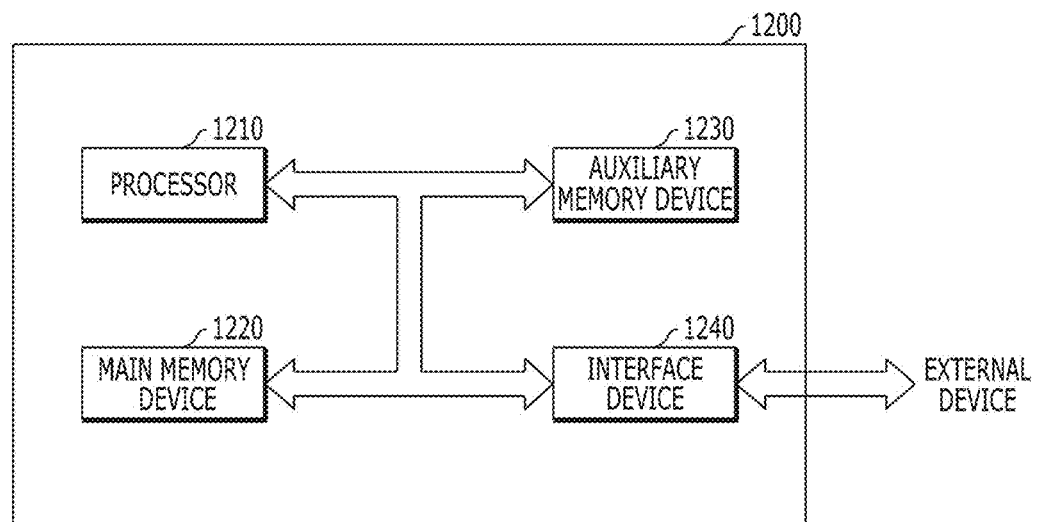
FIG. 13 is an example configuration diagram of a system including memory circuitry based on an implementation of the disclosed technology.

FIG. 13 is an example configuration diagram of a system including memory circuitry based on an implementation of the disclosed technology.

Referring to FIG. 13, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include a substrate; a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and an interface layer and a damping constant enhancing layer interposed between the tunnel barrier layer and the pinned layer, wherein the interface layer may be structured to reduce metal diffusion and the damping constant enhancing layer includes a material having a relatively high damping constant to suppress switching of the magnetization direction of the pinned layer. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices based on the implementations. For example, the auxiliary memory device 1230 may include a substrate; a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and an interface layer and a damping constant enhancing layer interposed between the tunnel barrier layer and the pinned layer, wherein the interface layer may be structured to reduce metal diffusion and the damping constant enhancing layer includes a material having a relatively high damping constant to suppress switching of the magnetization direction of the pinned layer. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 14:
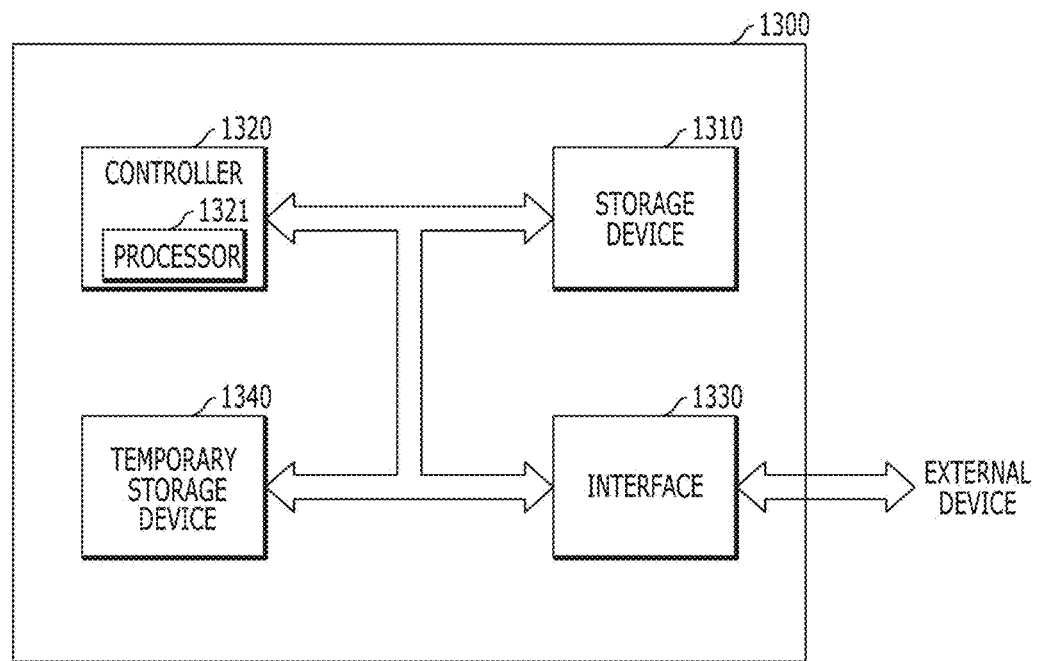
FIG. 14 is an example configuration diagram of a data storage system including memory circuitry based on an implementation of the disclosed technology.

FIG. 14 is an example configuration diagram of a data storage system including memory circuitry based on an implementation of the disclosed technology.

Referring to FIG. 14, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices based on the implementations. The temporary storage device 1340 may include a substrate; a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and an interface layer and a damping constant enhancing layer interposed between the tunnel barrier layer and the pinned layer, wherein the interface layer may be structured to reduce metal diffusion and the damping constant enhancing layer includes a material having a relatively high damping constant to suppress switching of the magnetization direction of the pinned layer. Through this, data storage characteristics of the storage device 1310 or the temporary storage device 1340 may be improved. As a result, operating characteristics and data storage characteristics of the data storage system 1300 may be improved.

Figure 15:
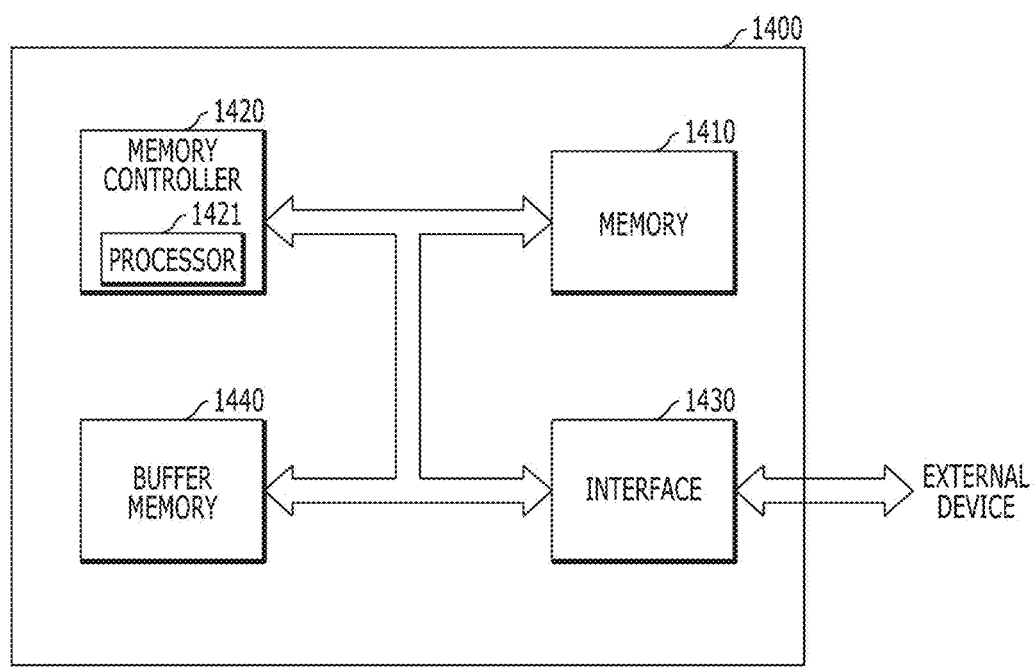
FIG. 15 is an example configuration diagram of a memory system including memory circuitry based on an implementation of the disclosed technology.

FIG. 15 is an example configuration diagram of a memory system including memory circuitry based on an implementation of the disclosed technology.

Referring to FIG. 15, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices based on the implementations. For example, the memory 1410 may include a substrate; a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and an interface layer and a damping constant enhancing layer interposed between the tunnel barrier layer and the pinned layer, wherein the interface layer may be structured to reduce metal diffusion and the damping constant enhancing layer includes a material having a relatively high damping constant to suppress switching of the magnetization direction of the pinned layer. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices based on the implementations. The buffer memory 1440 may include a substrate; a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and an interface layer and a damping constant enhancing layer interposed between the tunnel barrier layer and the pinned layer, wherein the interface layer may be structured to reduce metal diffusion and the damping constant enhancing layer includes a material having a relatively high damping constant to suppress switching of the magnetization direction of the pinned layer. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 11-15 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory includes:
 a substrate;
 a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and
 an interface layer and a damping constant enhancing layer interposed between the tunnel barrier layer and the pinned layer,
 wherein the interface layer is structured to reduce metal diffusion and the damping constant enhancing layer includes a material having a relatively high damping constant to suppress switching of the magnetization direction of the pinned layer.

2. The electronic device of claim 1, wherein the damping constant enhancing layer includes a material operable to block metal diffusion from other layers included in the semiconductor memory to the tunnel barrier layer.

3. The electronic device of claim 1, wherein the damping constant enhancing layer exhibits a damping constant higher than a damping constant of a magnetic material including Co, Fe, or B.

4. The electronic device of claim 1, wherein the damping constant enhancing layer includes tungsten (W), ruthenium (Ru), molybdenum (Mo), iridium (Ir), rhodium (Rh), or a combination thereof.

5. The electronic device of claim 1, wherein the interface layer includes an alloy based on Fe, Co, B, or a combination thereof.

6. The electronic device of claim 1, wherein the interface layer is disposed over the tunnel barrier layer and the damping constant enhancing layer is interposed between the interface layer and the pinned layer.

7. The electronic device of claim 1, wherein the damping constant enhancing layer is disposed over the tunnel barrier layer and the interface layer is interposed between the damping constant enhancing layer and the pinned layer.

8. The electronic device according to claim 1, further comprising a microprocessor which includes:
a control unit including an input port to receive a signal including a command from an external device, and performs at least one of extracting, decoding of the command, or controlling signal input or output to or from the microprocessor;
an operation unit including an input port coupled to the control unit to receive a decoded command to perform an operation based on the decoded command; and
a memory unit coupled to the operation unit and configured to store data for performing the operation, data corresponding to a result of performing the operation, or an address on which data associated with the operation is stored,
wherein the semiconductor memory is part of the memory unit in the microprocessor.

9. The electronic device according to claim 1, further comprising a processor which includes:
a core unit configured to perform, based on a command inputted from an external device in communication with the processor, an operation corresponding to the command, by using data;
a cache memory unit coupled to the core unit and configured to store data for performing the operation, data corresponding to a result of performing the operation, or an address of data for which the operation is performed; and
a bus interface coupled between the core unit and the cache memory unit to transfer data between the core unit and the cache memory unit,
wherein the cache memory unit includes the semiconductor memory.

10. The electronic device according to claim 1, further comprising a processing system which includes:
a processor configured to decode a command received by the processor and control an operation for processing information based on a result of decoding the command;
an auxiliary memory device coupled to the processor and configured to store a program for decoding the command and the information;
a main memory device coupled to the processor and the auxiliary memory device and configured to call and store the program and the information from the auxiliary memory device such that the processor can perform the operation using the program and the information when executing the program; and
an interface device configured to perform communication between at least one of the processor, the auxiliary memory device and the main memory device and the external device,
wherein at least one of the auxiliary memory device or the main memory device includes the semiconductor memory.

11. The electronic device according to claim 1, further comprising a data storage system which includes:
a storage device configured to store data and retain stored data without power supply;
a controller coupled to the storage device and configured to control transportation of data to and from the storage device according to a command inputted from an external device;
a temporary storage device coupled to the storage device and the controller and configured to temporarily store data being transferred between the storage device and the external device; and
an interface configured to perform communication between at least one of the storage device, the controller and the temporary storage device and the external device,
wherein at least one of the storage device or the temporary storage device includes the semiconductor memory.

12. The electronic device according to claim 1, further comprising a memory system which includes:
a memory configured to store data and retain stored data without power supply;
a memory controller coupled to the memory and configured to control transportation of data to and from the memory according to a command inputted from an external device;
a buffer memory configured to temporarily store data being moved between the memory and the external device; and
an interface configured to perform communication between at least one of the memory, the memory controller and the buffer memory and the external device,
wherein at least one of the memory or the buffer memory includes the semiconductor memory.

13. The electronic device of claim 1, wherein the damping constant enhancing layer includes a heavy metal.

14. An electronic device comprising a semiconductor memory, wherein the semiconductor memory comprises:
a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer;
a first interface layer and a second interface layer which are interposed between the tunnel barrier layer and the pinned layer; and
a damping constant enhancing layer interposed between the first interface layer and the second interface layer,
wherein the damping constant enhancing layer includes a material having a damping constant higher than that of a magnetic material including Co, Fe, or B.

15. The electronic device of claim 14, wherein the damping constant enhancing layer includes a material which is structured to block metal diffusion from other layers included in the semiconductor memory to the tunnel barrier layer and suppress switching of the magnetization direction of the pinned layer.

16. The electronic device of claim 14, wherein the damping constant enhancing layer includes a heavy metal.

17. The electronic device of claim 14, wherein the damping constant enhancing layer includes tungsten (W), ruthenium (Ru), molybdenum (Mo), iridium (Ir), rhodium (Rh), or a combination thereof.

18. The electronic device of claim 17, wherein the first interface layer and the second interface layer include an alloy based on Fe, Co, B, or a combination thereof.

19. The electronic device of claim 14, wherein the first interface layer and the second interface layer include the same material as each other.

20. The electronic device of claim 14, wherein the first interface layer and the second interface layer include different materials from each other.

* * * * *